(12) United States Patent
Karg et al.

(10) Patent No.: US 8,405,124 B2
(45) Date of Patent: Mar. 26, 2013

(54) LOGIC ELEMENT, AND INTEGRATED CIRCUIT OR FIELD PROGRAMMABLE GATE ARRAY

(75) Inventors: Siegfried Friedrich Karg, Adliswil (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 12/350,329

(22) Filed: Jan. 8, 2009

(65) Prior Publication Data
US 2009/0174430 A1    Jul. 9, 2009

(30) Foreign Application Priority Data
Jan. 9, 2008 (EP) .................................. 08100278

(51) Int. Cl.
*H01L 29/66* (2006.01)

(52) U.S. Cl. ............... 257/194; 257/8; 257/325; 326/41

(58) Field of Classification Search .................. 257/2, 3, 257/8, 194, 295, 529, 613, 325; 365/145, 365/148; 326/41
See application file for complete search history.

(56) References Cited

U.S. PATENT DOCUMENTS
6,815,744 B1   11/2004   Beck et al.
7,763,880 B2 *  7/2010   Williams ........................... 257/8

OTHER PUBLICATIONS

Quirk, Michael; "CMOS Technology" Semiconductor Manufacturing Technology. 2001. pp. 55-57.*
Yang, et al., "Memristive switching mechanism for metal/oxide/metal nanodevices," Nature Nantechnology 3, pp. 429-433, 2008.

* cited by examiner

*Primary Examiner* — Kimberly Rizkallah
*Assistant Examiner* — Errol Fernandes
(74) *Attorney, Agent, or Firm* — Cantor Colburn LLP; Gail Zarick

(57) ABSTRACT

A complementary logic element including first and second transistor elements. The first and second gate electrodes of the two transistor elements are electrically parallel to form a common gate. Both the coupling layers of the first and the second transistor element include a resistance switching material, a conductivity of which may be altered by causing an ion concentration to alter if an electrical voltage signal of an appropriate polarity is applied. The first and second transistor elements also include an ion conductor layer that is capable of accepting ions from the coupling layer and of releasing ions into the coupling layer. The coupling layers and ion conductor layers are such that the application of an electrical signal of a given polarity to the gate enhances the electrical conductivity of the first coupling layer and diminishes the electrical conductivity of the second, or vice versa.

15 Claims, 4 Drawing Sheets

LOGIC ELEMENT, AND INTEGRATED CIRCUIT OR FIELD PROGRAMMABLE GATE ARRAY

CROSS REFERENCE TO RELATED APPLICATION

This application claims priority under 35 U.S.C. 119 from European Patent Application No. 08100278.4 filed Jan. 9, 2008, the entire contents of which are incorporated herein by reference.

BACKGROUND OF THE INVENTION

1. Field of the Invention

The present invention relates to a logic element. More particularly, the present invention relates to an integrated circuit or a field programmable gate array that includes such a logic element.

2. Description of Related Art

Complementary logic elements such as CMOS (Complementary metal-oxide-semiconductor) elements are of great importance for integrated circuits. CMOS technology is used in chips such as microprocessors, microcontrollers, static RAM, other digital logic circuits and camera devices. Two important characteristics of CMOS devices are high noise immunity and low static power supply drain. Significant power is only drawn when its transistors are switching between on- and off-states. The logic state of the CMOS is volatile and the input voltage has therefore to be maintained. However, due to gate leakage, static power consumption is increasing with increasing miniaturization. The need to maintain input voltage will lead to considerable power consumption and heating in future CMOS generations.

Another class of logic elements is the programmable logic device or PLD. Unlike a logic gate based on CMOS, which has a fixed function, a PLD has an undefined function at the time of manufacture. Before the PLD can be used in a circuit it must be programmed. A PLD can be considered as a combination of a logic device and a memory device. Antifuse devices, EEPROMs, solid-electrolyte switches or phase-change memories are used as memory devices or switches. PLDs such as FPGAs (field-programmable gate arrays) have more flexibility than fixed logic gates, can be re-programmed to fix errors and have a shorter time-to-market. However, FPGAs are generally slower than their application-specific integrated circuit (ASIC) counterparts, draw more power and are less area-efficient due to the combination of logic and memory elements.

SUMMARY OF THE INVENTION

According to an aspect of the invention a first transistor element is combined with a second transistor element to form a complementary logic element. The first and second transistor elements each include a source electrode, a drain electrode, a gate electrode and a coupling layer between the source electrode and the drain electrode. In a preferred embodiment of this complementary logic element, the first and second gate electrodes are electrically parallel to form a common gate. Further, both the first and the second coupling layers include a resistance switching material, the conductivity of which may be altered by causing an ion concentration to alter if an electrical voltage signal of an appropriate polarity is applied. To this end, the first and second transistor elements also include an ion conductor layer that is capable of accepting ions from the coupling layer and of releasing ions into the coupling layer. The pairs of the coupling layers and the associated ion conductor layers of the two transistor elements are such that the application of an electrical signal of a given polarity to the gate enhances the electrical conductivity of the first coupling layer and diminishes the electrical conductivity of the second coupling layer, or vice versa; i.e. diminishes the electrical conductivity of the first coupling layer and enhances the electrical conductivity of the second coupling layer.

The switching state features the substantial advantage of being non-volatile. In contrast to conventional CMOS devices, the logic element maintains its logic state when the input voltage at the gate electrode is turned off. This enables the logic circuit to be put into a standby mode which is disconnected from the voltage source and, hence, does not consume significant power.

A suitable and preferred class of materials for the resistance switching material of the coupling layer is transition metal oxides, where the ion concentration caused to be altered by the electrical signal is an oxygen concentration. In alternative embodiments, the ion concentration of the resistance switching material that can be altered can be a concentration of different ions, such as a concentration of protons or metal ions. In the following, the change of ion concentration is described to be due to the migration of oxygen vacancies. Particularly, materials exhibiting a so-called "filling-controlled metal-insulator transition" are preferred for the transition-metal-oxide resistance switching material. Like for the ion conductor layer, a material with a high mobility of oxygen vacancies of for example $10^{-9}$ cm$^2$/Vs or higher may be chosen.

Materials exhibiting a filling-controlled metal-insulator transition include $ABO_{3-\delta}$ perovskites, A being an alkaline earth element, a rare earth element, or a combination thereof, and B being a transition-metal element. Examples are lanthanum and/or strontium titanium oxide $(La,Sr)TiO_{3-\delta}$, yttrium and/or calcium titanium oxide $(Y,Ca)TiO_{3-\delta}$ and lanthanum and/or strontium manganese oxide $(La,Sr)MnO_{3-\delta}$. Further transition metal oxides that are advantageous for the present invention include corundum such as vanadium and/or chromium oxide $(V,Cr)_2O_{3-\delta}$. Other materials that can be used advantageously include binary transition metal oxides such as nickel oxide $NiO_{1-\delta}$ or titanium oxide $TiO_{1-\delta}$.

The material parameters such as the oxygen deficiency parameter $\delta$ and the ratio of the alkaline earth and rare earth elements in the above materials are preferably chosen so that the resistance switching material in one of two switching states is electrically insulating with essentially no free charge carriers. In the other switching state, due to the addition or removal of some oxygen vacancies, there are free charge carriers forming a conduction band and thus bringing about metallic properties.

The ion conductor layer is preferably electrically insulating. If the coupling layer includes a transition-metal oxide of the above-mentioned kind, the ion conductor layer is capable of storing and/or releasing oxygen vacancies from or into the coupling layer, respectively, while retaining its characteristics as an insulator. Preferably, the ion conductor layer includes a material with a high mobility of oxygen vacancies of, for example, $10^{-9}$ cm$^2$/Vs or higher. For example, the ion conductor layer may be one of: a fluorite-type oxide, a perovskite with intrinsic and/or extrinsic vacancies, an Aurivillius-type oxide, and a pyrochloride. Specific examples of materials for an oxygen-ion conductor layer include: fluorite-type oxides with extrinsic oxide-ion vacancies such as yttrium- and/or scandium-stabilized zirconioa $(ZrO_2)_{1-x}((Y, Sc)_2O_3)_x$ with x=0 to 0.9, gadolinium-doped ceria (Ce,Gd)

$O_{2-x}$ with x=0 to 0.5, perovskites with intrinsic and/or extrinsic vacancies such as lanthanum strontium gallium magnesium oxide $(La,Sr)(Ga,Mg)O_{3-x}$ with x=0 to 0.5, barium indium oxide $BaInO_{3-x}$ with x=0 to 0.5, lithium lanthanum titanium oxide $(Li,La)TiO_{3-x}$ with x=0 to 0.5, Aurivillius-type oxides such as bismuth vanadium titanium copper oxide $Bi_4(V,Ti,Cu)_2O_{11-x}$ with x=0 to 3, pyrochlores such as gadolinium zirconium titanium oxide $Gd_2(Zr,Ti)_2O_7$, and oxides such as lanthanum molybdenum oxide $La_2Mo_2O_9$.

In the above-discussed embodiments, the ion conductor layer and the coupling layer are separate layers with an interface between them. In accordance with another preferred embodiment, however, the ion conductor layer and the coupling layer are of a same (preferably transition metal oxide) material, and there is no physical interface between the ion conductor layer and the coupling layer, the layer being only different in their positions (i.e., for example, when the oxygen vacancies are in a first region (layer) of the transition metal oxide portion of the transistor element, the conductivity between the electrodes is high, and when the oxygen vacancies are in a second, different region (layer) of the transition metal oxide portion of the transistor element, the conductivity between the electrodes is lower).

The pairs of the coupling layer and the associated ion conductor layer of the first and second transistor element according to the above teaching exhibit a complementary behavior in reaction to an electrical signal applied to the gate electrode. To this end, they may differ in one of the following:

The first coupling layer resistance switching material may be of a first material type, and the second coupling layer resistance switching material may be of a second, different material type. For example, the first material type may be a filling controlled oxide that is insulating in its basic state and becomes conductive if it is supplied with additional oxygen vacancies, whereas the second material type may be a filling controlled oxide that is conductive in its basic state and may be rendered insulating by additional oxygen vacancies.

As a second option, the first and second pairs may be arranged in different order with reference to a voltage application direction, so that an electrical signal of a given polarity for example drives additional oxygen vacancies into the first coupling layer and drives additional oxygen vacancies out of the second coupling layer.

Now referring to the first option (different material types of the coupling layer), the first material type may in its basic state be an insulating transition metal oxide with stoichiometric composition such as $SrTiO_3$ and $LaTiO_3$ (integer formal valence of 4+ and 3+, respectively), which becomes conductive if supplied with oxygen vacancies, whereas the second material type may in its basic state contain a slight surplus of oxygen compared to the stoichiometric composition, such as $LaTiO_{3.04}$, so that there are electrons in the conduction band and the second material type in its basic state is metallic. This second material type may be rendered insulating by introducing oxygen vacancies, i.e., the formal valence of Ti of initially 3.08+ approaches an integer value (3+) upon introducing oxygen vacancies and therefore becomes insulating. As an alternative for the second material type, the ratio of the alkaline earth and rare earth elements added to the transition metal oxide may be tuned such that the second material type in its basic state is metallic, for example, a fraction of $La^{3+}$ ions may be replaced by $Sr^{2-}$ as in $La_{0.9}Sr_{0.1}VO_3$. This second material type may be rendered insulating by introducing oxygen vacancies, i.e., the formal valence of V of initially 3.1+ approaches an integer value (3+) upon introducing oxygen vacancies and therefore becomes insulating. The incorporation of a number of oxygen vacancies δ leads in the first material type to an increase of electrons in the conduction band whereas in the second material type electrons from the conduction band are swallowed by oxygen vacancies.

The first option has the further advantage of being relatively straightforward to manufacture. Manufacturing processes known from CMOS technology may be used, and the deposition and structuring of transition metal oxide layers of the type usable for the coupling layer and the ion conductor layer has already been shown, for example, for ferroelectric memories.

The two transistor elements in accordance with both options may be on a common substrate and may comprise layers added by known deposition techniques including CVD, PVD, sputtering etc.

In the following descriptions, the positional relationship of different layers is sometimes addressed by terms like "horizontal", "vertical", "lateral," etc. where "horizontal" or "lateral" denote orientations/directions in the layer plane defined by the substrate surface on which the layers are deposited, the "vertical" position is the position with respect to a coordinate perpendicular to said layer plane. "On top of" or "above" refer to a vertical position further remote from the substrate bulk (and thus closer to the surface of the device), and "below" or "underneath" to the opposite thereof.

In accordance with the first option, the first and second coupling layers and/or the source and drain electrodes may be provided on top of the substrate (possibly with appropriate interface layers on the substrate) and thus be at a same vertical position in the layer stacking. The ion conductor layer(s) may be provided on top of the coupling layers, whereas the gate electrode(s) is/are provided on the ion conductor layer(s), again with possible interface layers between them. In this way, as is known also for conventional CMOS elements, a capacitor is formed between the gate and the substrate or, in a state where the coupling layer is metallic, between the gate on the one hand and the substrate and coupling layer on the other hand. In contrast to conventional CMOS devices, however, no constant voltage across the gate-substrate conductor is required for maintaining an "open" or "closed" state of a transistor element.

In accordance with the second option, in one of the two transistor elements, the ion conductor layer is underneath the coupling layer, and an additional insulating layer is preferably provided between the gate and the coupling layer.

The layers in themselves may optionally be inhomogeneous and comprise sub-layers.

The ion conductor layer may be electrically insulating in all switching states of the logic element and may be a part of the gate electrode or form a layer between the gate electrode and the coupling layer. The ion conductor layer may be of a same material for both transistor elements and may even form a contiguous layer over both transistor elements (the gate electrode may then also be contiguous over both transistor elements).

As one alternative, the ion conducting layer may be electrically conducting; then, of course, the ion conducting layer must not directly contact the source and drain electrodes, and in the state in which the resistance switching material is conducting contributes to the conductivity between the source and drain electrodes.

The invention also pertains to an integrated circuit (IC) or field programmable gate array incorporating a plurality of logic elements according to the invention. An integrated circuit according to the invention may for example be any integrated circuit device that according to the state of the art has been formed as CMOS device, including but not limited to a microprocessor, a microcontroller, a static—and due to the approach according to the invention non-volatile—RAM, any ASIC, etc. A field programmable gate array (FPGA) according to the invention comprises a plurality of the logic elements as fast-reprogrammable toggle switches serving as the memory element in the FPGA.

Logic and memory devices based on the approach according to the invention can be integrated on top of existing (e.g. Si CMOS) circuitry (without consuming Si wafer area) using conventional, low-temperature deposition techniques. Si based elements (such as EEPROM), in contrast, consume Si wafer area or require high-temperature annealing steps (polycrystalline Si) that affect the lower lying layers. Therefore, logic elements based on the invention are Back End of Line (BEOL) compatible. This compatibility allows more dense arrays than EEPROM memory at lower power, lower operating voltage and faster programming speed.

Also, the logic elements according to the invention can not only be stacked on Si CMOS, but also a further layer of logic elements according to the invention can be stacked on existing logic elements (again because of the low-temperature and conventional processing). Stacking allows, for example, the arrangement of memory elements in close proximity to the related logic element (just on top). This allows short wiring (fast) and reduced electromagnetic interferences. An IC or FPGA according to the invention can comprise a 3D array of logic elements according to the invention, since the logic elements according to the invention are 3D-stackable. This, of course, again enhances the areal density compared to conventional FPGAs.

BRIEF DESCRIPTION OF THE DRAWINGS

In the following, embodiments of the invention will be described referring to accompanying drawings. The drawings are all schematic and not to scale. In the drawings, same reference numerals refer to same or corresponding elements.

DETAILED DESCRIPTION OF THE PREFERRED EMBODIMENTS

Figure 1:
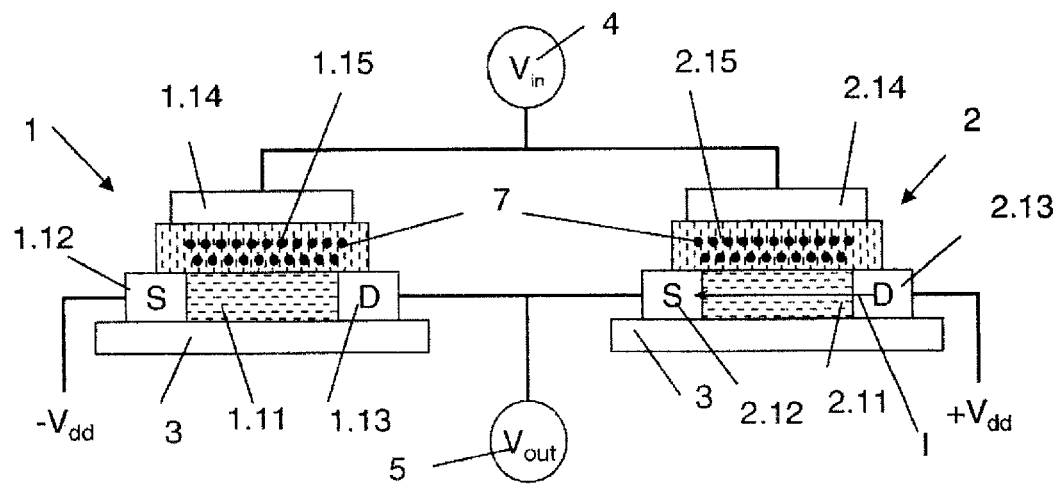
FIG. 1 shows a scheme of a logic element according to the invention in a first switching state.

Referring to FIG. 1, there is shown a logic element that includes a first transistor element 1 and a second transistor element 2. On a substrate 3—that is preferably common to the first and second transistor elements and may be a substrate of a type known for integrated circuits, such as a silicon substrate—the transistor elements 1, 2 comprise a coupling layer 1.11, 2.11 that is in contact with two electrodes S (Source) 1.12, 2.12 and D (Drain) 1.13, 2.13. A third electrode 1.14, 2.14, being a gate electrode, is separated from the coupling layer 1.11, 2.11 by an ion conductor layer 1.15, 2.15. The ion conductor layer is an insulating layer having a high oxygen ion mobility. The first coupling layer 1.11 includes a transition metal oxide of a first type, whereas the second coupling layer 2.11 includes a transition metal oxide of a second type.

Whereas the two transistor elements 1, 2 in this and the following figures are illustrated as separate elements, this need not be the case. Rather, they are preferably arranged as structures on a common substrate, and some of the layers, such as the ion conductor layers 1.15, 2.15 may optionally be contiguous over both transistor elements. The coupling layers in the embodiment of FIG. 1 may be on a same layer level (at a same vertical position) and formed shaped to each other by known structuring method (such as masking techniques, lithography etc.).

Additional oxygen vacancies 7 are formed either in the coupling layer 1.11, 2.11 or in the ion conduction layer 1.15, 2.15 or in both.

In FIG. 1, both coupling layers 1.11, 2.11 are illustrated in a state herein referred to as "basic state" or 'first switching state" where they do not comprise any additional oxygen vacancies 7. Note that the difference between the basic state and a second switching state need not be a qualitative difference but can be merely quantitative. For example, the material of the second type in its basic state may correspond to the first type material in its basic state with some added oxygen ions, and there need not be a difference between the first type material in its first switching state and the second type material in its second switching state.

In the illustrated embodiment, the source electrode 1.12 of the first transistor element is at a first potential $-V_{dd}$ and the drain electrode 2.13 of the second transistor element 2 is at a second potential $+V_{dd}$. Optionally, the first or the second potential $-V_{dd}$ or $+V_{dd}$ can be connected to the "bulk" terminal (the backside of the substrate; not shown in the figure) and on ground potential. The drain electrode 1.13 of the first transistor element 1 and the source electrode 2.12 of the second transistor element 2 are connected to an output lead ($V_{out}$) 5.

The transition metal oxide of the first type is electrically insulating in its basic state. Therefore, in the first transistor element 1 there is no contact between the two electrodes 1.12, 1.13. The transition metal oxide of the second type is electrically conducting in its basic state, so that the source and drain electrodes 2.12, 2.13 of the second transistor element 2 are connected with each other. Therefore, in the configuration of FIG. 1 the output voltage is $+V_{dd}$.

In this and the following figures, the arrow I denotes the possible drain-to-source current flow if the output lead draws a current.

Figure 2:
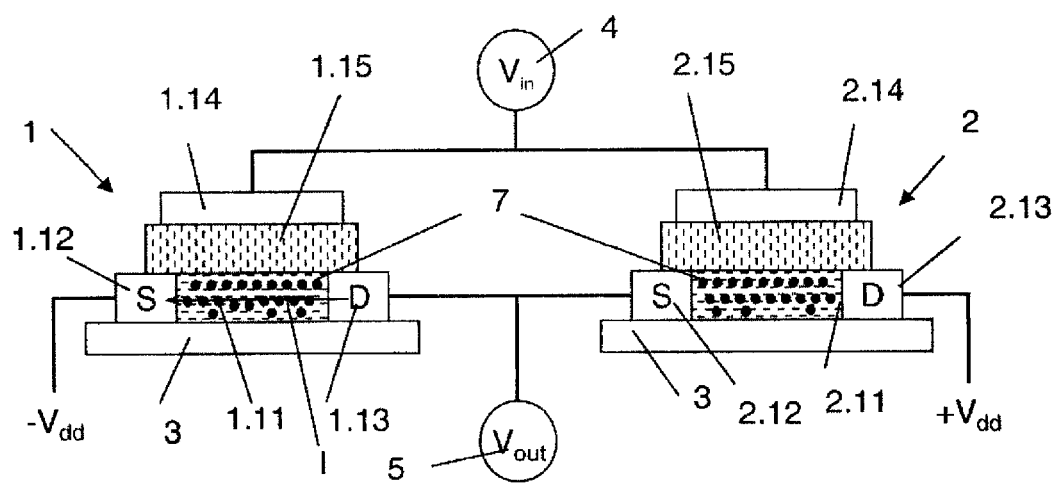
FIG. 2 shows the logic element of FIG. 1 in a second switching state.

The gate electrodes 1.14, 2.14 are connected to an input lead ($V_{in}$) 4. As shown in FIG. 2, if a positive voltage is applied to the gate electrodes 1.14, 2.14, positively charged additional oxygen vacancies 7 are pushed from the ion conductor layers 1.15, 2.15 into the respective coupling layer 1.11, 2.11. The additional oxygen vacancies 7 lead to metallic conduction in the transition metal oxide material of the first type and to insulation in the transition metal oxide material of the second type. The insulating behavior of the ion conduction layers 1.15, 2.15 is unaffected by the ion migration. By the first coupling layer 1.11 now being conducting, and since the second coupling layer is insulating, the output lead 5 is connected to the first potential $-V_{dd}$; thus the polarity at the output lead 5 is inverted. Once set, the output voltage remains unchanged even if the input is disconnected. Only if a negative voltage is applied to the gate electrodes 1.14, 2.14, the oxygen vacancies will be pulled back into the insulation layer, and the switching state of FIG. 1 will be again achieved.

The logic element is therefore bistable, and its switching state is non-volatile.

The configuration of FIGS. 1 and 2 may in practice be altered in several ways, including but not limited to:
- some or all of the illustrated layers may comprise several sub-layers of different materials, for example for reasons of better material growth during manufacturing, as chemical barrier layers;
- the D electrode 1.13 of the first transistor element and the S electrode 2.12 of the second transistor element may be a common part; and
- the gate electrodes 1.14, 2.14 and/or the ion conduction layers 1.15, 2.15 may together be formed by one common gate layer/ion conductor layer.

The resistivity of the transition metal oxide can be changed by more than 4 orders of magnitude with currently known transition metal oxides of the first and second type, giving rise to a high on/off ratio.

Currently known suitable materials include:
First type materials:
$SrTiO_{3-\delta}$: For $\delta=0$ $\rho>10$ $\Omega cm$, for $\delta=0.001$ $\rho=1$ $m\Omega cm$
$LaTiO_{3-\delta}$: For $\delta=0$ $\rho>10$ $\Omega cm$, for $\delta=0.001$ $\rho=1$ $m\Omega cm$
Second type materials:
$La_{0.9}Sr_{0.1}VO_{3-\delta}$: For $\delta=0$ $\rho=1$ $m\Omega cm$, for $\delta=0.01$ $\rho>10$ $\Omega cm$,
This latter material being an example of a first sub-type of the second type materials, in which first-sub-type a fraction of lanthanum $La^{3+}$ ions is replaced by strontium $Sr^{2+}$ ions, and
$LaTiO_{3.04-\delta}$: For $\delta=0$ $\rho=1$ $m\Omega cm$, for $\delta=0.04$ $\rho>10$ $\Omega cm$,
This latter material being of a second sub-type of the second type materials, in which an surplus of oxygen ions lead to a surplus of charge carriers in the basic state causing metallic behavior.

Figure 3A:
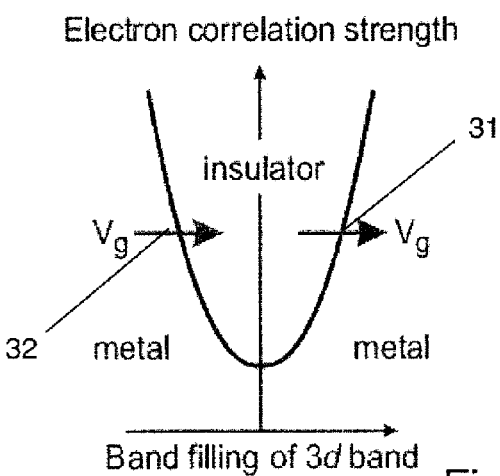
FIG. 3a illustrates a scheme of the electron correlation strength as a function of the band filling of the 3d transition-metal band.

More generally, FIG. 3 shows a schematic metal-insulator phase diagram of transition metal oxides as a function of electron correlation strength and band filling of a 3d transition metal band. For a non-zero electron correlation strength and small band filling, i.e., essentially an integer formal valence of the transition metal element, an insulating state is obtained (labeled "insulator" in the figure), whereas with both, increased and reduced band filling a metallic state is assumed. Referring to FIG. 3a, the right hand side arrow 31 denotes the transition of a material of the first type when the material in its basic state is insulating and applying a gate voltage $V_g$ causes a filling of the 3d band, and a metallic state is obtained. The left hand side arrow 32 shows the transition from the basic state of a material of the second type when the material in its basic state is metallic and applying a gate voltage $V_g$ causes a further filling of the 3d band and an insulating state is obtained. Whereas the first type material undergoes a transition from an insulating state into a metallic state, the second type material changes from a metallic state into an insulating state.

Figure 3B:
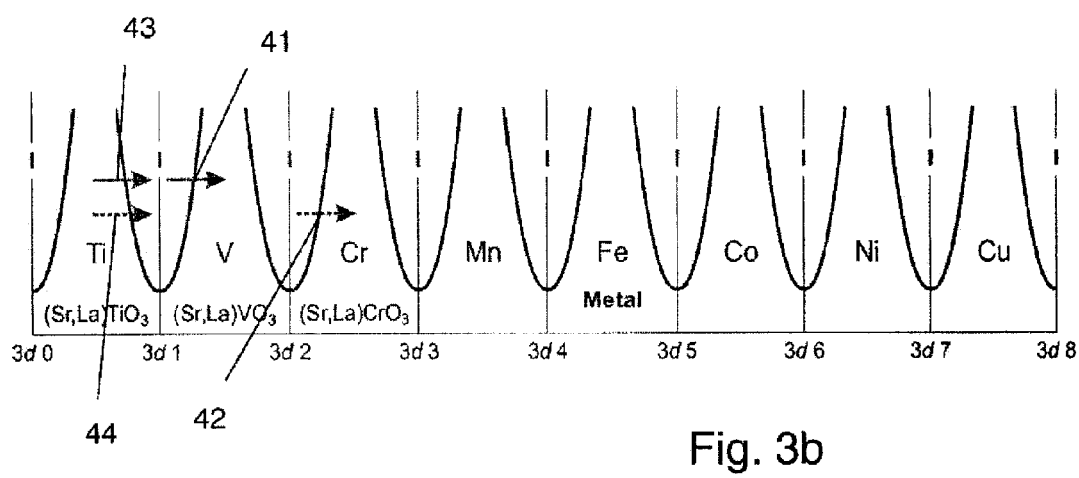
FIG. 3b shows the electron correlation strength as in FIG. 3a for the different 3d transition-metal materials.

Referring to FIG. 3b, there is shown the phase diagram for band fillings of different 3d transition metal bands, where the respective element exhibiting the band filling is also indicated in the figure. Arrows 41, 43 show a first possible material pairing of a material of the first type with a material of the second type, whereas arrows 42, 44 show a second possible material pairing. As illustrated, it is not necessary that the used first and second type materials have a corresponding transition metal group number. Of course, also other material pairings are possible.

Figure 4:
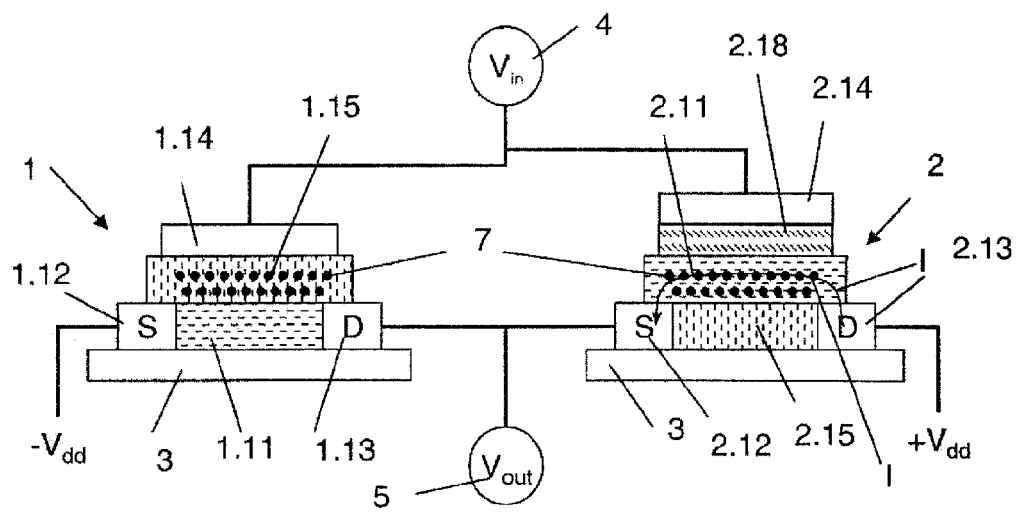
FIG. 4 shows an alternative embodiment of a logic element according to the invention.
Figure 5:
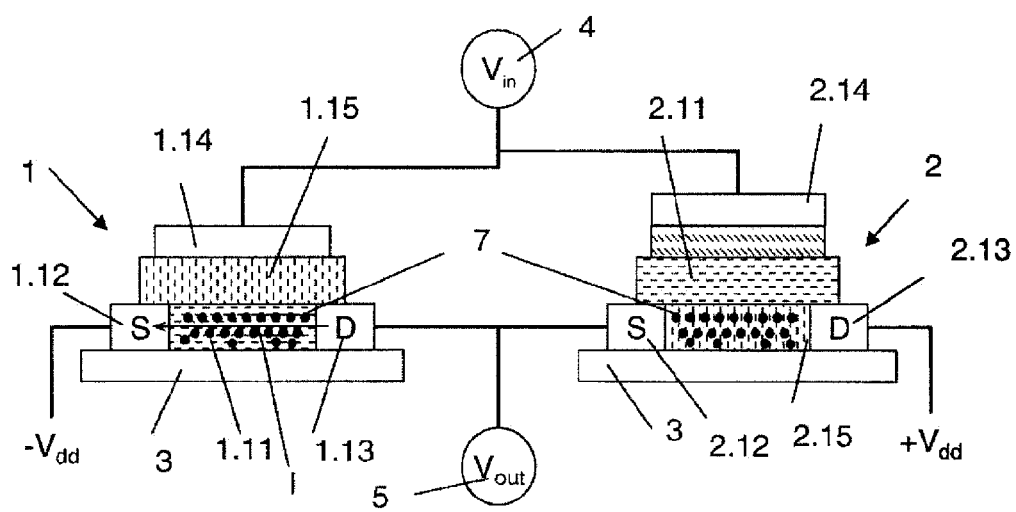
FIG. 5 shows the logic element of FIG. 4 in a second switching state.

FIGS. 4 and 5 show a variant of the logic element of FIGS. 1 and 2, which variant is based on the above-referenced second option of making the first and second coupling layer/ion conductor layer different. Only the differences from FIGS. 1 and 2 are described:

In the second transistor element 2, the arrangement of the coupling layer 2.11 and the ion conductor layer 2.15 is reversed compared to the arrangement of the first transistor element 1. In exchange, the first and second coupling layers 1.11, 2.11 may comprise a transition metal oxide of a same type, for example of a same material. In the embodiment illustrated in FIGS. 4 and 5, both coupling layers are made of material of the first type, i.e. the type that is an insulator in the basic state and becomes conducting if oxygen vacancies are added.

In the first switching state illustrated in FIG. 4, the second coupling layer 2.11 comprises additional oxygen vacancies 7, whereas the first coupling layer 1.11 is free of additional oxygen vacancies 7. As illustrated by the arrow I, in the second transistor element 2, there is an electrically conducting connection between the S and D electrodes via the second coupling layer 2.11, whereas the path between the S and D electrodes of the second transistor is closed.

In the second switching state illustrated in FIG. 5, the first transistor element 1 is "open", whereas there is no electrically conducting connection between the source and drain electrodes of the second transistor element 2, because all available additional oxygen vacancies 7 are in the electrically insulating ion conductor layer 2.15.

In the illustrated configuration, the second transistor element comprises an additional insulating layer 2.18 not capable of conducting oxygen vacancies. This additional insulating layer assures that there can not be a direct electrical connection between the gate electrode 2.14 and the coupling layer 2.11. The additional insulating layer may also be present in the first transistor element 1, so that the gate electrodes of the two transistor elements are at a common vertical position (they may again form a common contiguous layer) for example for reasons of easier manufacturing.

Figure 6:
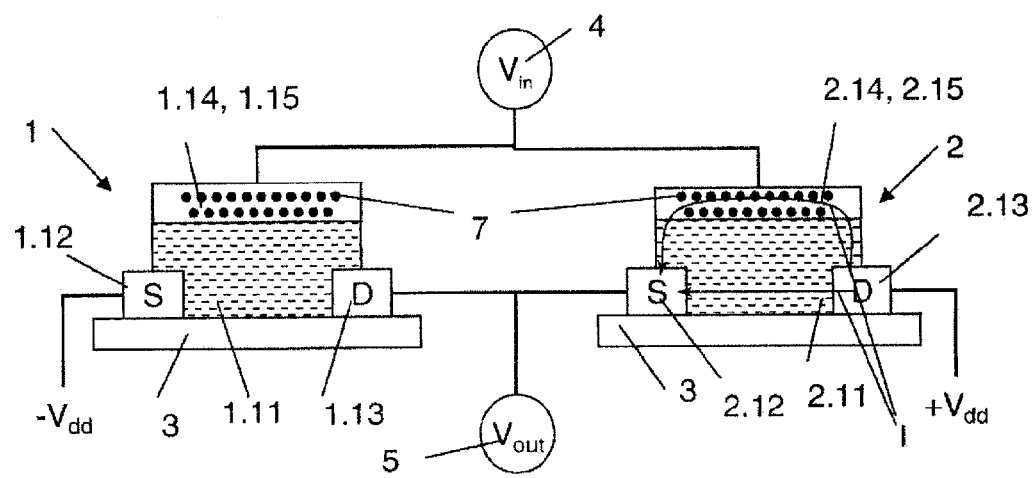
FIG. 6 shows yet another embodiment of a logic element according to the invention.
Figure 7:
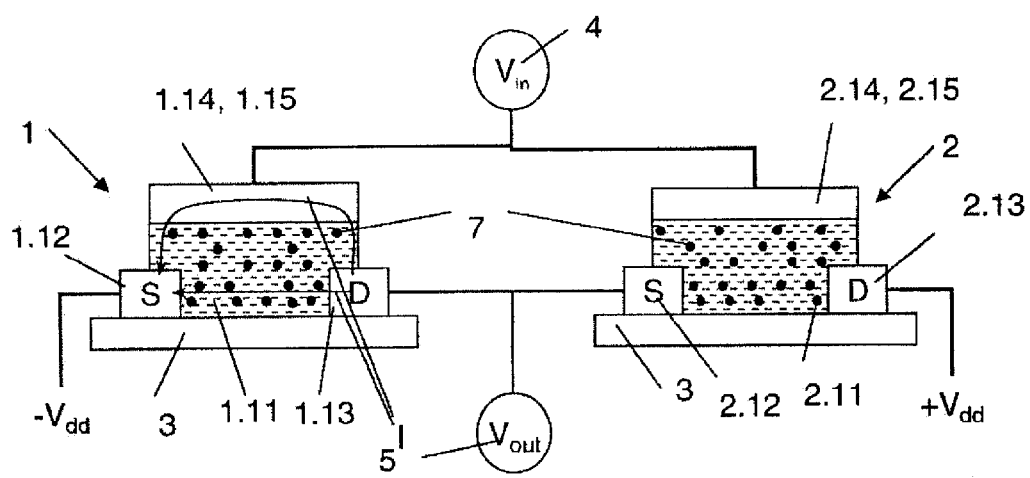
FIG. 7 shows the logic element of FIG. 6 in a second switching state.

Referring to FIGS. 6 and 7 there is shown yet another variant. The elements of the logic element, the material composition of the coupling layers 1.11, 2.11 and the first and second switching states correspond to the embodiment of FIGS. 1 and 2. In the embodiment of FIGS. 6 and 7, however, the logic element does not comprise any separate, insulating ion conduction layer; rather, the ion conduction layer is formed by a metallic, oxygen ion conducting part of the gate electrodes 1.14, 2.14.

In this embodiment, the conductivity of the gate electrodes 1.14, 2.14 themselves adds to the conductivity of the connection between the S and D electrodes in the respective "open" states of the transistor elements 1, 2; also, the power consumed when an electrical signal is applied to the gate for the switching process is higher than in the previous embodiments, however, there may be embodiments where this disadvantage is outweighed by the somewhat simpler construction.

Deviating from the above-described embodiments, further variants may be envisaged. For example, whereas transition metal oxides with migrating oxygen vacancies are a preferred class of resistance switching materials for the coupling layers, this is not a necessity. Rather, other materials a charge carrier density of which may be influenced due to migration of ions or even other effect may be used for at least one of the coupling layers. For example, instead of oxygen ions, hydrogen ions may be caused to migrate.

Further, the logic element according to the invention may be used for other purposes than the above-described devices, such as non-volatile memories where each logic element stores one data bit.

While the invention has been described with reference to preferred embodiments, those skilled in the art will recognize that the above and other variations may be made without departing from the spirit and scope of the invention as set forth in the following claims.

What is claimed is:

1. A logic element comprising a first transistor element with a first source electrode, a first drain electrode and a first coupling layer in contact with the first source electrode and the first drain electrode, the logic element further comprising a second transistor element with a second source electrode, a second drain electrode and a second coupling layer in contact with the second source electrode and the second drain electrode, wherein the first and second transistor elements comprise a common gate, and wherein:
the first and second coupling layers each comprises a resistance switching material;
the first and the second coupling layers are arranged so as to be able to accept ions from an ion conductor layer and to release ions into the ion conductor layer wherein the ion conductor layer comprises a metallic, oxygen ion conducting part of a gate electrode material of the common gate;
the first and second coupling layer are, referring to a substrate surface plane, at different horizontal positions;
the first coupling layer is of a first resistance switching material;
the second coupling layer is of a second resistance switching material different from the first resistance switching material;
the first resistance switching material is such that an insulator-to-metal transition is induceable by an increase of a concentration of a specific ion type;
the second resistance switching material is such that a metal-to-insulator transition is induceable by an increase of a concentration of said ion type; and
the application of an electrical signal to the gate causes an ion concentration in the first and the second coupling layer to be altered, wherein application of an electrical signal of a given polarity to the gate enhances the electrical conductivity of the first coupling layer and diminishes the electrical conductivity of the second coupling layer, and causes the polarity at the output lead to be inverted.

2. The logic element according to claim 1, wherein the ion conductor layer is arranged adjacent to the first and the second coupling layers.

3. The logic element according to claim 2, wherein the first and second transistor elements comprise a structure of layers on a surface of a substrate.

4. The logic element according to claim 1, wherein the first coupling layer and the second coupling layer are at a same vertical position.

5. The logic element according to claim 1, wherein the first and second coupling layers and the ion conductor layer or ion conductor layers are such that application of an electrical signal to the gate causes an alteration of an oxygen vacancy concentration in the first and second coupling layers.

6. The logic element according to claim 5, wherein a material of the ion conductor layer exhibits an oxygen vacancy mobility of at least $10^{-9}$ cm$^2$/Vs.

7. The logic element according to claim 6, wherein the resistance switching material comprises an oxide of at least one of titanium, vanadium, chromium, manganese, iron, cobalt, nickel, and copper.

8. The logic element according to claim 1, wherein the first and second transistor elements comprise a structure of layers on a surface of a substrate.

9. The logic element according to claim 8, wherein:
the first and second transistor elements comprise a structure of layers on a surface of a substrate.

10. The logic element according to claim 9, wherein:
the first coupling layer is of a first resistance switching material;
the second coupling layer is of a second resistance switching material different from the first resistance switching material;
said first resistance switching material is such that an insulator-to-metal transition is induceable by an increase of a concentration of a specific ion type; and
said second resistance switching material is such that a metal-to-insulator transition is induceable by an increase of a concentration of said ion type.

11. The logic element according to claim 10, wherein the first coupling layer and the second coupling layer are at a same vertical position.

12. The logic element according to claim 11, wherein:
the first and second coupling layers and the ion conductor layer or ion conductor layers are such that application of an electrical signal to the gate causes an alteration of an oxygen vacancy concentration in the first and second coupling layers; and
a material of the ion conductor layer exhibits an oxygen vacancy mobility of at least 10-9 cm2/Vs.

13. An integrated circuit which is a field programmable gate array comprising a plurality of logic elements, each element comprising a first transistor element with a first source electrode, a first drain electrode and a first coupling layer in contact with the first source electrode and the first drain electrode, the logic element further comprising a second transistor element with a second source electrode, a second drain electrode and a second coupling layer in contact with the second source electrode and the second drain electrode, the first drain electrode and the second source electrode are connected to an output lead, wherein the first and second transistor elements comprise a common gate, and wherein:
the first and second coupling layers each comprises a resistance switching material;
the first and the second coupling layers are arranged so as to be able to accept ions from an ion conductor layer and to release ions into the ion conductor layer wherein the ion conductor layer is comprises a metallic, oxygen ion conducting part of a gate electrode material of the common gate;
the first and second coupling layer are, referring to a substrate surface plane, at different horizontal positions;
the first coupling layer is of a first resistance switching material;
the second coupling layer is of a second resistance switching material different from the first resistance switching material;
the first resistance switching material is such that an insulator-to-metal transition is induceable by an increase of a concentration of a specific ion type;
the second resistance switching material is such that a metal-to-insulator transition is induceable by an increase of a concentration of said ion type; and the application of an electrical signal to the gate causes an ion concentration in the first and the second coupling layer to be altered, wherein application of an electrical signal of a given polarity to the gate enhances the electrical conductivity of the first coupling layer and diminishes the electrical conductivity of the second coupling layer, and causes the polarity at the output lead to be inverted.

14. The integrated circuit of claim 13, wherein the logic elements are arranged in a 3-dimensional stack.

15. A logic element comprising a first transistor element with a first source electrode, a first drain electrode and a first coupling layer in contact with the first source electrode and the first drain electrode, the logic element further comprising a second transistor element with a second source electrode, a second drain electrode and a second coupling layer in contact with the second source electrode and the second drain electrode, the first drain electrode and the second source electrode are connected to an output lead, wherein the first and second transistor elements comprise a common gate, and wherein:

the first and second coupling layers each comprises a resistance switching material;

the first and the second coupling layers are arranged so as to be able to accept ions from an ion conductor layer and to release ions into the ion conductor layer wherein the ion conductor is comprises a metallic, oxygen ion conducting part of a gate electrode material of the common gate;

the first and second coupling layer are, referring to a substrate surface plane, at different horizontal positions;

the first coupling layer is of a first resistance switching material;

the second coupling layer is of a second resistance switching material different from the first resistance switching material;

the first resistance switching material is such that an insulator-to-metal transition is induceable by an increase of a concentration of a specific ion type;

the second resistance switching material is such that a metal-to-insulator transition is induceable by an increase of a concentration of said ion type; and the application of an electrical signal to the gate causes an ion concentration in the first and the second coupling layer to be altered, wherein application of an electrical signal of a given polarity to the gate enhances the electrical conductivity of the first coupling layer and diminishes the electrical conductivity of the second coupling layer, and causes the polarity at the output lead to be inverted.

* * * * *